(12) United States Patent
Sharon et al.

(10) Patent No.: US 11,488,684 B1
(45) Date of Patent: Nov. 1, 2022

(54) STORAGE SYSTEM AND METHOD FOR DECISION-BASED MEMORY READ THRESHOLD CALIBRATION

(71) Applicant: Western Digital Technologies, Inc., San Jose, CA (US)

(72) Inventors: Eran Sharon, Rishon Lezion (IL); Ran Zamir, Ramat Gan (IL); Alexander Bazarsky, Holon (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/352,953

(22) Filed: Jun. 21, 2021

(51) Int. Cl.
| | | |
|---|---|---|
| *E04D 13/00* | (2006.01) | |
| *E04D 13/08* | (2006.01) | |
| *F16F 1/36* | (2006.01) | |
| *G11C 29/52* | (2006.01) | |
| *G11C 29/42* | (2006.01) | |
| *G11C 29/10* | (2006.01) | |
| *H03K 19/0185* | (2006.01) | |
| *H03K 19/21* | (2006.01) | |
| *G11C 29/12* | (2006.01) | |

(52) U.S. Cl.
CPC .......... *G11C 29/52* (2013.01); *G11C 29/10* (2013.01); *G11C 29/12005* (2013.01); *G11C 29/42* (2013.01); *H03K 19/018521* (2013.01); *H03K 19/21* (2013.01); *G11C 2029/1202* (2013.01); *G11C 2207/2254* (2013.01)

(58) Field of Classification Search
None
See application file for complete search history.

(56) References Cited

U.S. PATENT DOCUMENTS

| | | | |
|---|---|---|---|
| 8,315,092 B2 | 11/2012 | Strasser et al. | |
| 9,697,905 B2 | 7/2017 | Sharon et al. | |
| 9,818,488 B2 | 11/2017 | Sankaranarayanan et al. | |
| 10,699,791 B2* | 6/2020 | Pletka | G06F 3/0604 |
| 2011/0182119 A1* | 7/2011 | Strasser | G11C 29/021 |
| | | | 365/185.24 |
| 2016/0284424 A1* | 9/2016 | Das | G06F 3/064 |
| 2017/0148510 A1* | 5/2017 | Bazarsky | G11C 11/5642 |
| 2017/0271031 A1* | 9/2017 | Sharon | G06F 11/3058 |
| 2019/0043836 A1* | 2/2019 | Fastow | H01L 27/11573 |
| 2020/0089569 A1* | 3/2020 | Cadloni | G11C 29/52 |
| 2020/0105353 A1* | 4/2020 | Sharon | G11C 29/021 |
| 2020/0364103 A1* | 11/2020 | Sharifi Tehrani | G11C 16/26 |
| 2021/0376854 A1* | 12/2021 | Zamir | G11C 29/42 |
| 2022/0113894 A1* | 4/2022 | Avraham | G06F 3/0679 |

* cited by examiner

*Primary Examiner* — Ly D Pham
(74) *Attorney, Agent, or Firm* — Crowell & Moring LLP

(57) ABSTRACT

A read threshold voltage can vary over time due to process variation, data retention issues, and program disturb conditions. A storage system can calibrate the read threshold voltage using data from a decoded codeword read from a wordline in the memory. For example, the storage system can use the data instead of syndrome weight in a bit error rate estimate scan (BES). As another example, the storage system can use the data to generate a bit error rate distribution, which can be used instead of a cell voltage distribution histogram. Using these techniques can help reduce latency and power consumption, increase throughput, and improve quality of service.

19 Claims, 10 Drawing Sheets

STORAGE SYSTEM AND METHOD FOR DECISION-BASED MEMORY READ THRESHOLD CALIBRATION

BACKGROUND

A storage system contains a memory to store data. To increase storage density, multi-level cells (MLCs) can be used to store more than one bit per memory cell in the memory. In operation, after determining a sequence of bits to store in a particular memory cell, the memory cell is programmed to a state by setting a threshold voltage that corresponds to a sequence of bits. To read the memory cell, the memory cell is sensed, and the memory cell's threshold voltage is compared to one or more read voltages. However, the sensed threshold voltage can sometimes vary from the written threshold voltage due to one or more factors, such as process variation, data retention issues, and program disturb conditions.

DETAILED DESCRIPTION

The following embodiments are generally related to a storage system and method for decision-based memory read threshold calibration. In one embodiment, a storage system is provided comprising a memory and a controller. The controller is configured to decode a codeword read from a wordline in the memory and cause read threshold calibration to be performed using data from the decoded codeword. In another embodiment, a method is provided that is performed in a storage system with a memory. The method comprises decoding a codeword read from a wordline in the memory; generating a bit error rate distribution from data in the decoded codeword; and performing a read threshold calibration by finding minima in the bit error rate distribution. In yet another embodiment a storage system is provided comprising a memory, means for decoding a codeword read from a wordline in the memory; means for determining that a bit error rate in the decoded codeword is above a threshold; and means for causing read threshold calibration to be performed using data from the decoded codeword instead of syndrome weight in a bit error rate estimate scan (BES). Other embodiments are provided, and each of these embodiments can be used alone or in combination.

Figure 1A:
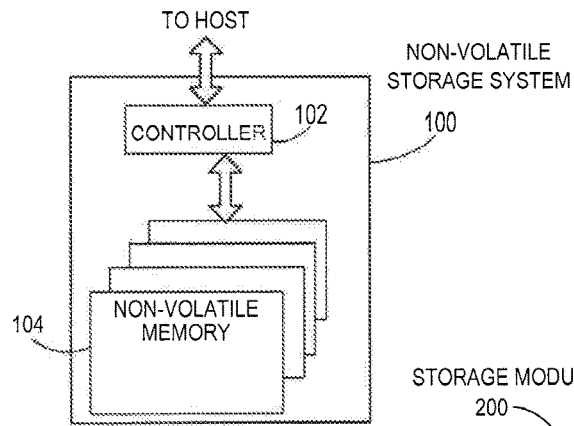
FIG. 1A is a block diagram of a non-volatile storage system of an embodiment.
Figure 1B:
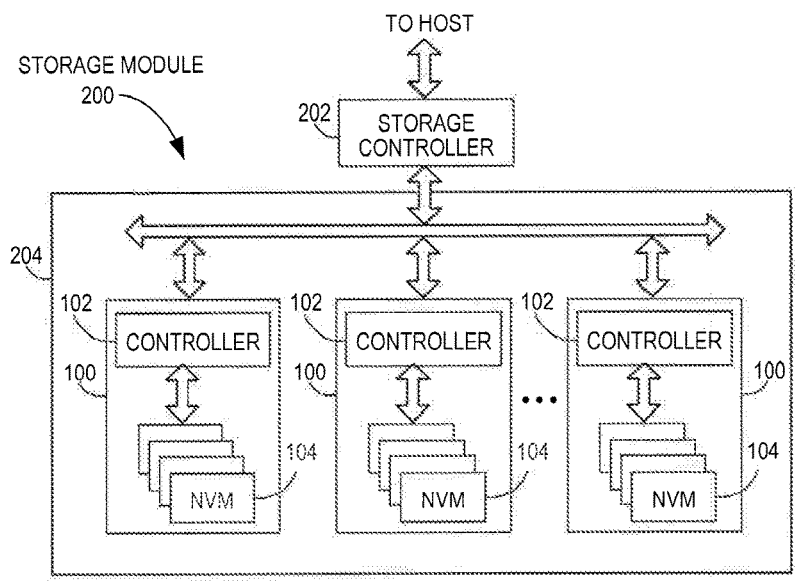
FIG. 1B is a block diagram illustrating a storage module of an embodiment.
Figure 1C:
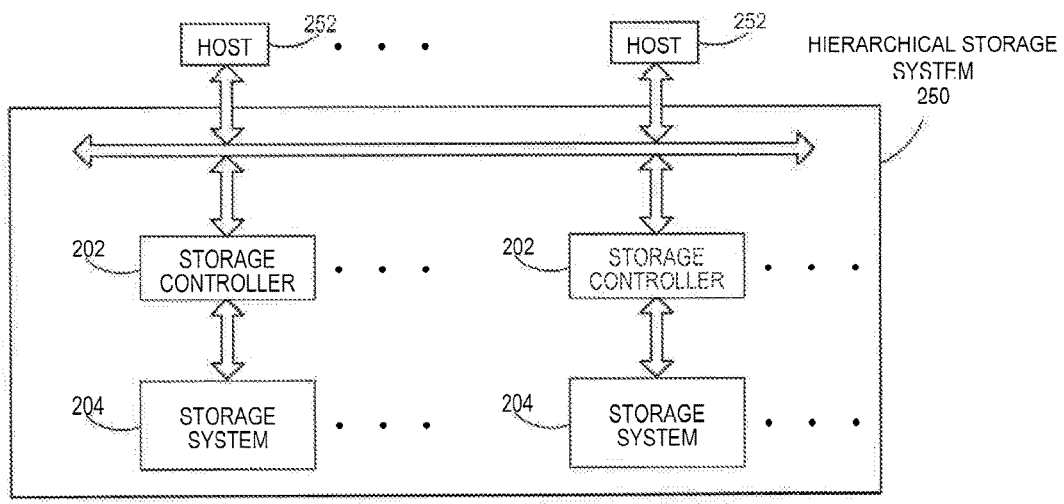
FIG. 1C is a block diagram illustrating a hierarchical storage system of an embodiment.

Turning now to the drawings, storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), quad-level cell (QLC) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card (or USB, SSD, etc.). In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
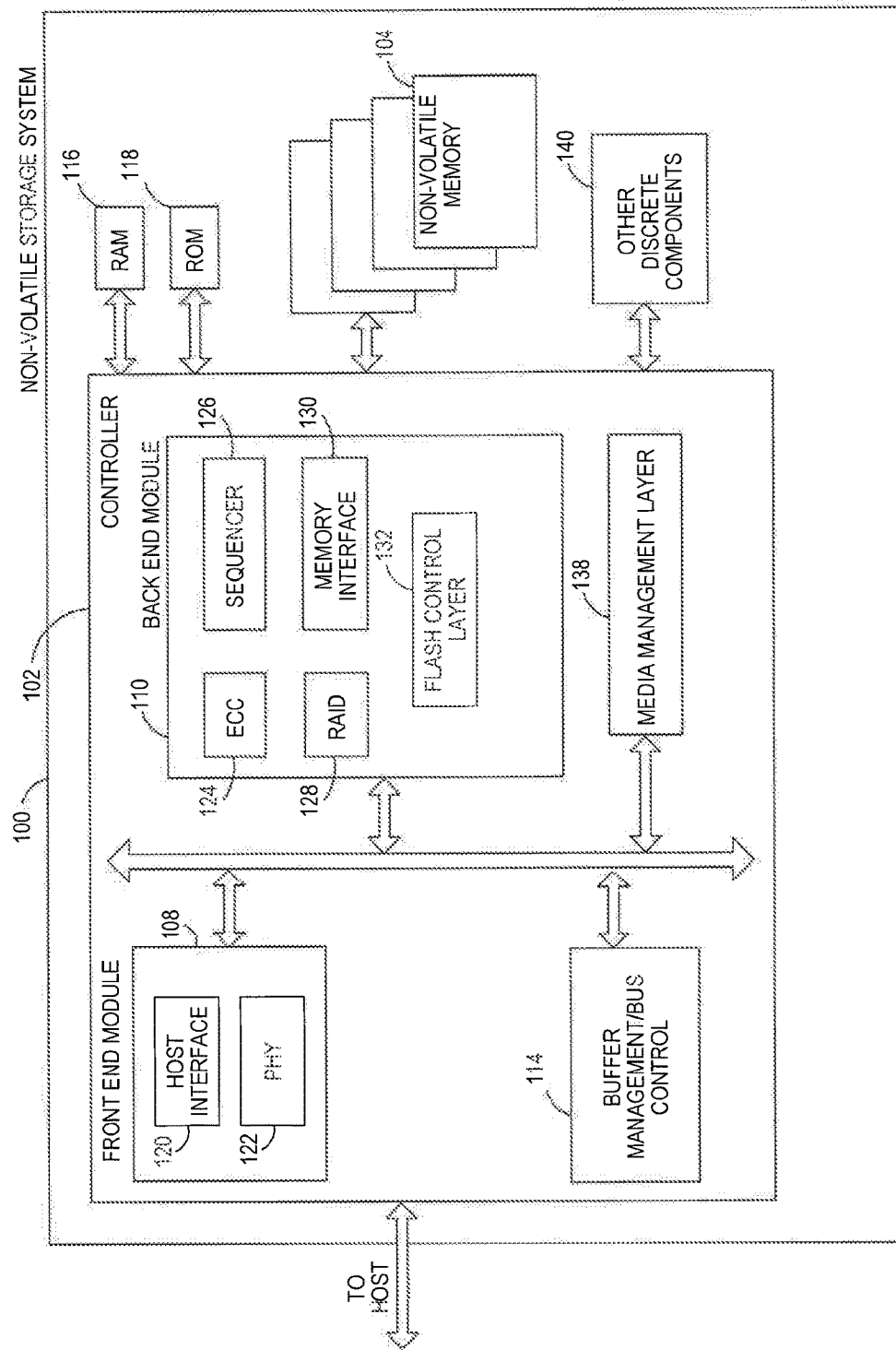
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
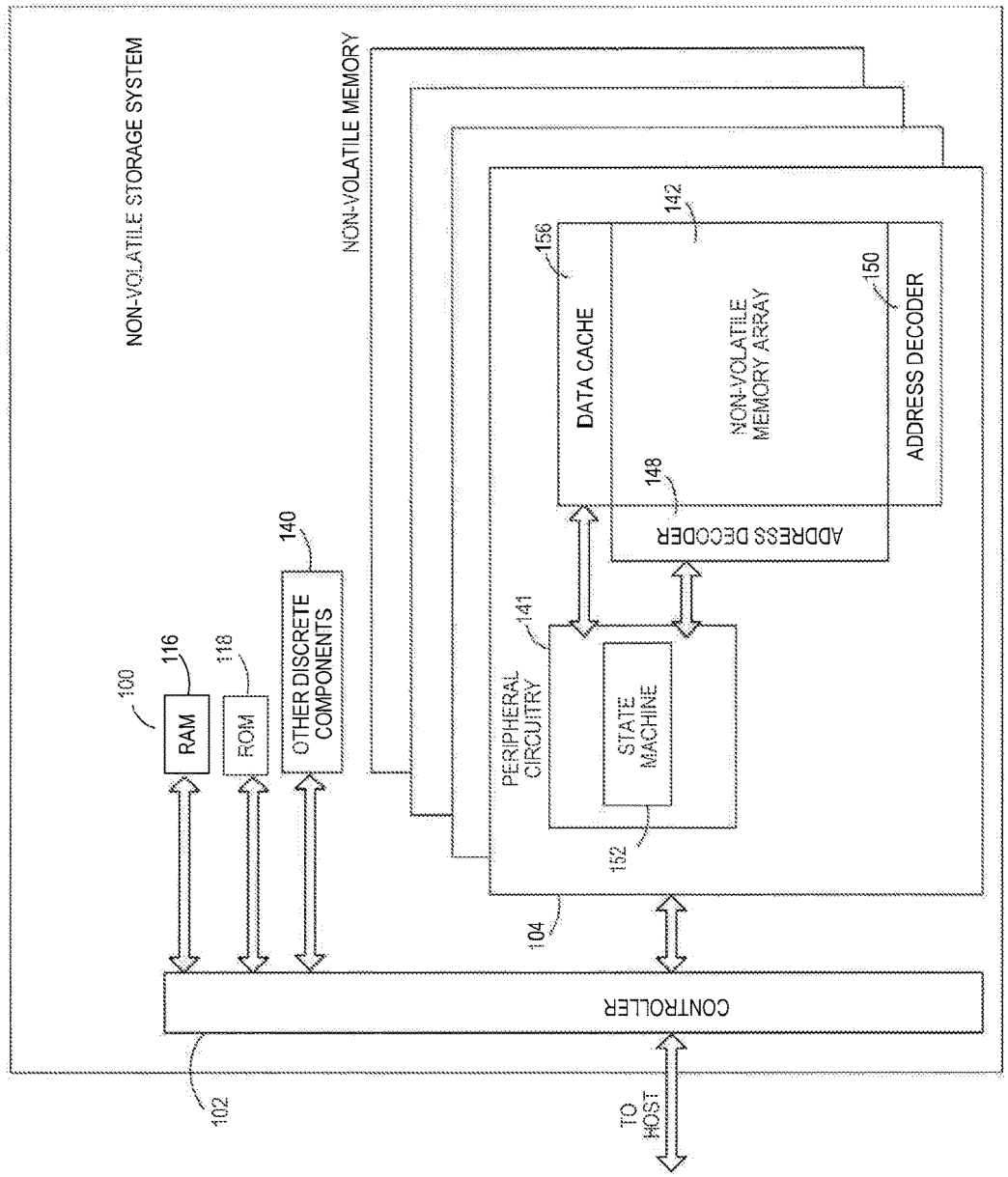
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
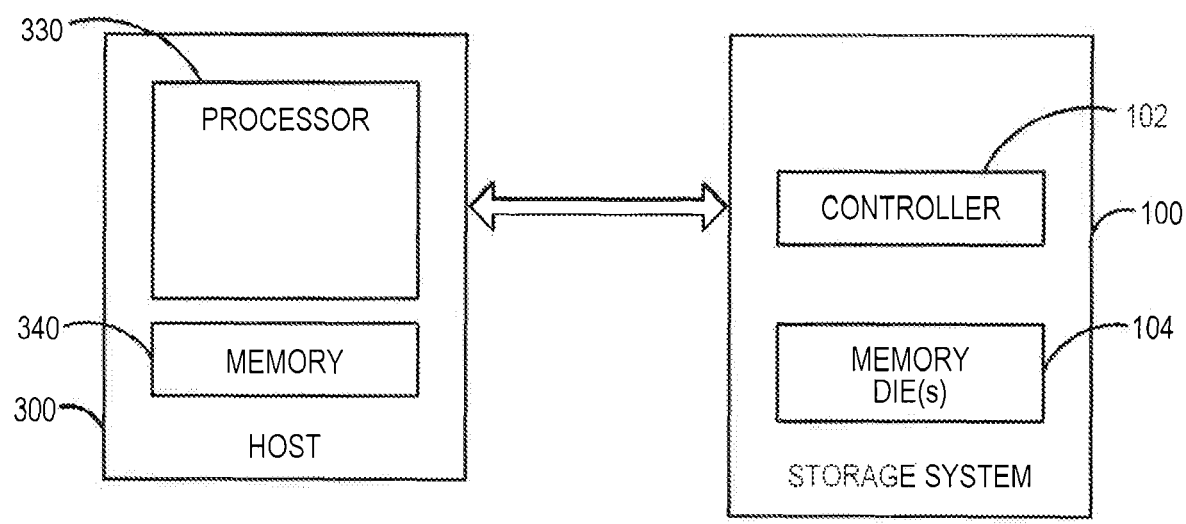
FIG. 3 is a diagram of a host and a storage system of an embodiment.

Turning again to the drawings, FIG. 3 is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340) to the storage system 100 for storage in the storage system's memory 104.

As mentioned above, multi-level cells (MLCs) can be used to store more than one bit per memory cell in the memory 104. In operation, after determining a sequence of bits to store in a particular memory cell, the memory cell is programmed to a state by setting a threshold voltage that corresponds to a sequence of bits. To read the memory cell, the memory cell is sensed, and the memory cell's threshold voltage is compared to one or more read voltages. However, the sensed threshold voltage can sometimes vary from the written threshold voltage due to one or more factors, such as data retention issues and program disturb conditions. As such, the default read thresholds that are used to read from the memory (e.g., Flash) in a new device may not be suitable for a device that has sustained such conditions.

There are several methods that can be used to help recalibrate a read threshold. For example, valley search (VS) is an algorithm that can be used to optimize a read threshold by finding the minima on a cell voltage distribution (CVD) histogram between every two adjacent states. It is typically implemented inside the NAND die, but a controller-based version of valley search can be used. A bit error rate (BER) estimation scan (BES) is another method to calibrate and optimize read thresholds. BES relies on optimizing the read threshold such that syndrome weight (SW), which is a proxy for the bit error rate, is minimized. Optimizing the syndrome weight/bit error rate has benefits over optimizing the minima of a CVD histogram as it reduces the object function directly, while the minima on a CVD histogram does not always translate into bit error rate minima. However, valley search is very simple and can be executed without the need of a complicated controller, and the results are often good enough, especially when maximum precision is not required and speed is more important.

When calibrating read thresholds using the BES algorithm, syndrome weight is minimized. However, the syndrome weight is only a noisy proxy for the actual bit error rate, and the error that accumulates due to this noise may impair the quality of the read threshold calibration. Furthermore, due this noise, the BES algorithm may conduct an exhaustive search over many hypotheses, greatly increasing its complexity and execution time. On the other hand, valley search (or legacy CVD methods) finds the minima on a CVD histogram to serve as read thresholds. This may be a sub-optimal result as it does not necessarily correspond to the optimal read thresholds that provide the minimal bit error rate.

So, these methods can be said to use blind estimations (i.e., estimations without knowledge of the programmed data). In some cases where the programmed data is available, using a blind estimation in the process of calibration will improve accuracy, simplify the search, and reduce latency. In order to get optimal results faster, in both cases, it may be preferred to use the bit error rate itself after decoding when it is available.

The following embodiments can be used to enhance read threshold calibration, potentially leveraging complementary metal-oxide-semiconductor (CMOS) bonded array (CBA) technology to improve the accuracy of the calibration process and reduce overhead from unnecessary information transfer to the controller 102. These embodiments use a "decision-based" method for calibrating memory read thresholds in that they utilize knowledge of the programmed data when it exists. This knowledge can be obtained after a read error correction code (ECC) code word was successfully decoded.

There are several scenarios in which the programmed data is known. For example, when conducting periodic system maintenance, the data is usually decodable after conducting REH (Read Error Handling) flow or when the ECC decoder alerts of a high bit error rate but was still able to decode the data (i.e., when the bit error rate is above a threshold). During a long sequential read, in case of a high bit error rate notification, calibrating read thresholds based on the decoded data can also supply better read thresholds for that same sequential read without the need for significant maintenance operations, thus improving sequential read throughput. In these scenarios, calibrating the read thresholds can result in a much faster and more accurate result.

These embodiments can use programmed data and read data to directly calibrate parameters to minimize the failed bit count (FBC), which is synonymous to bit error rate. These embodiments can be incorporated with an existing system, such as read threshold calibration by BES based on syndrome weight, replacing the syndrome weight element (which has an uncertainty noise factor) with FBC (which is measured and unambiguous). In order to reduce transfer overhead and due to the relative simplicity of operating on the bit error rate, which does not require knowledge regarding the low-density parity check (LDPC) code, these embodiments can place the related blocks on the CBA or on the memory die 104 itself to support an existing valley search operation.

Figure 4:
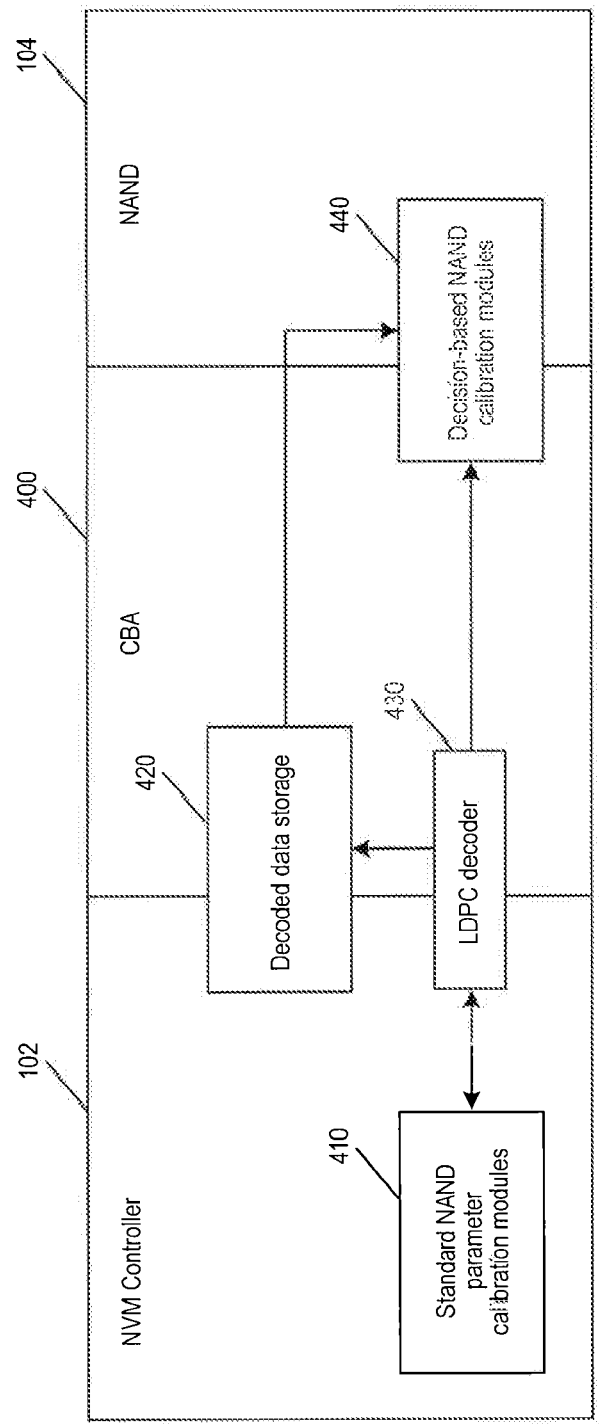
FIG. 4 is a block diagram of a storage system of an embodiment.

Returning to the drawings, FIG. 4 is a block diagram of a storage system 100 of an embodiment. As shown in FIG. 4, in this embodiment, the storage system 100 comprises a controller 102, a CBA 400, and the memory 104. In addition to the components already described above for the controller 102, the controller 102 in this embodiment comprises standard NAND parameter calibration modules 410, as well as an LDPC decoder 430, which can be placed on the CBA 400 instead of the controller 102. If a light version of the LDPC decoder 430 is placed on the CBA 400, there may not be a need to even reach the controller 102 for the process of parameter calibration. The controller 102 can simply be supplied with the end-product parameters. The controller 102 in this embodiment also comprises decoded data storage 420, which can be also placed on the CBA 400 instead of the controller 102. The storage system 100 also comprises decision-based NAND parameter calibration modules that are either located on the CBA 400 (along with potential storage of decoded data) or on the memory 104 to support operations such as valley search.

Figure 5:
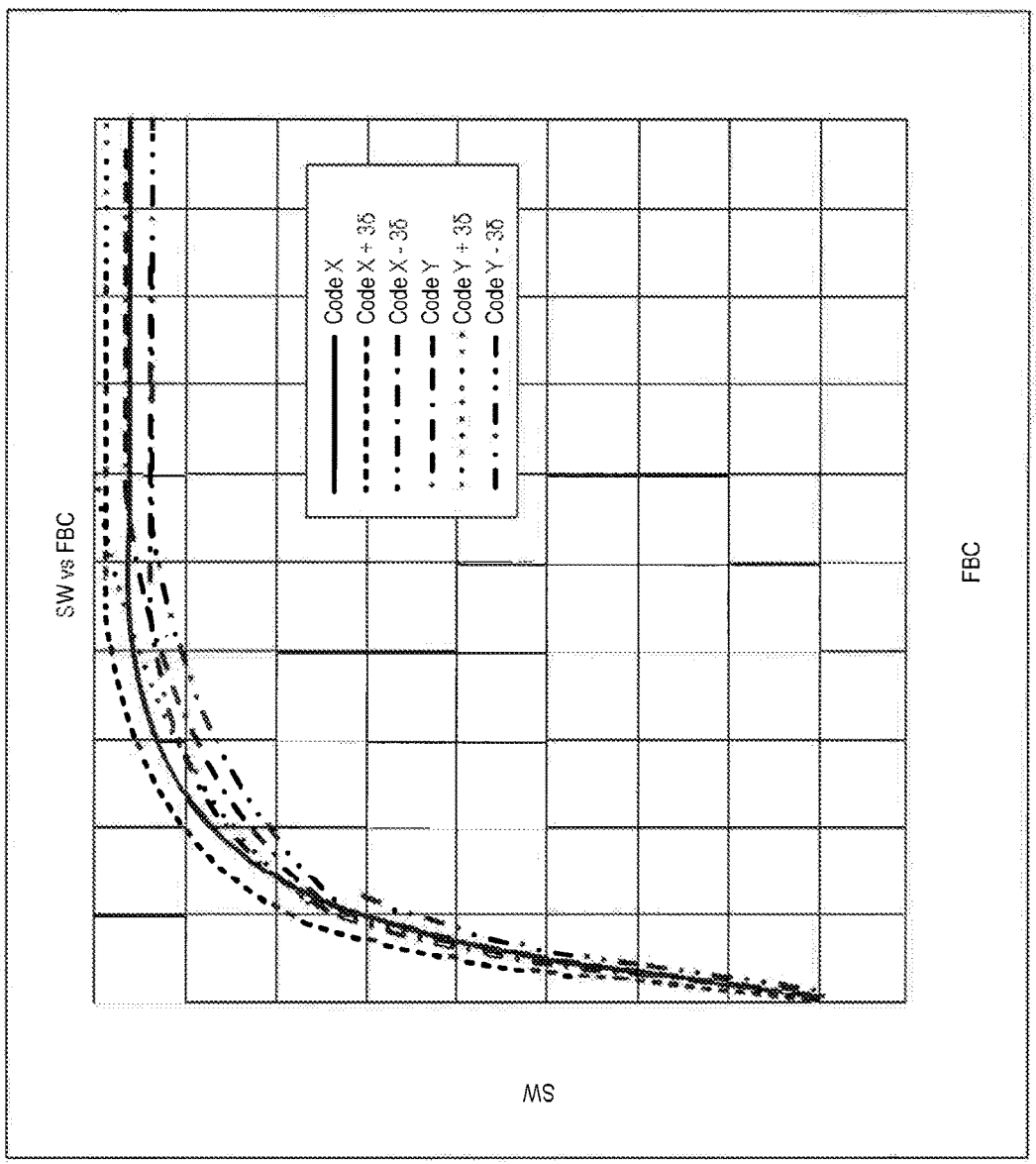
FIG. 5 is a graph of an embodiment showing a relation between syndrome weight (SW) and failed bit count (FBC) for different low-density parity-check (LDPC) codes.

There are two main disadvantages associated with optimizing the syndrome weight as a representative for bit error rate. The first disadvantage is saturation of the FBC/syndrome weight curve, as shown in FIG. 5. When the FBC is relatively low (<400), the curve is fairly linear. This means that reducing syndrome weight also directly reduces FBC. However, when FBC gets higher, an increase in FBC shows less increase in syndrome weight and makes it harder to distinguish (flattening). FIG. 5 shows that the quality of estimating FBC by using syndrome weight is code dependent. Code X's curve flatten at lower FBCs, which adds a larger margin of error when using it to calibrate NAND parameters.

Figure 6:
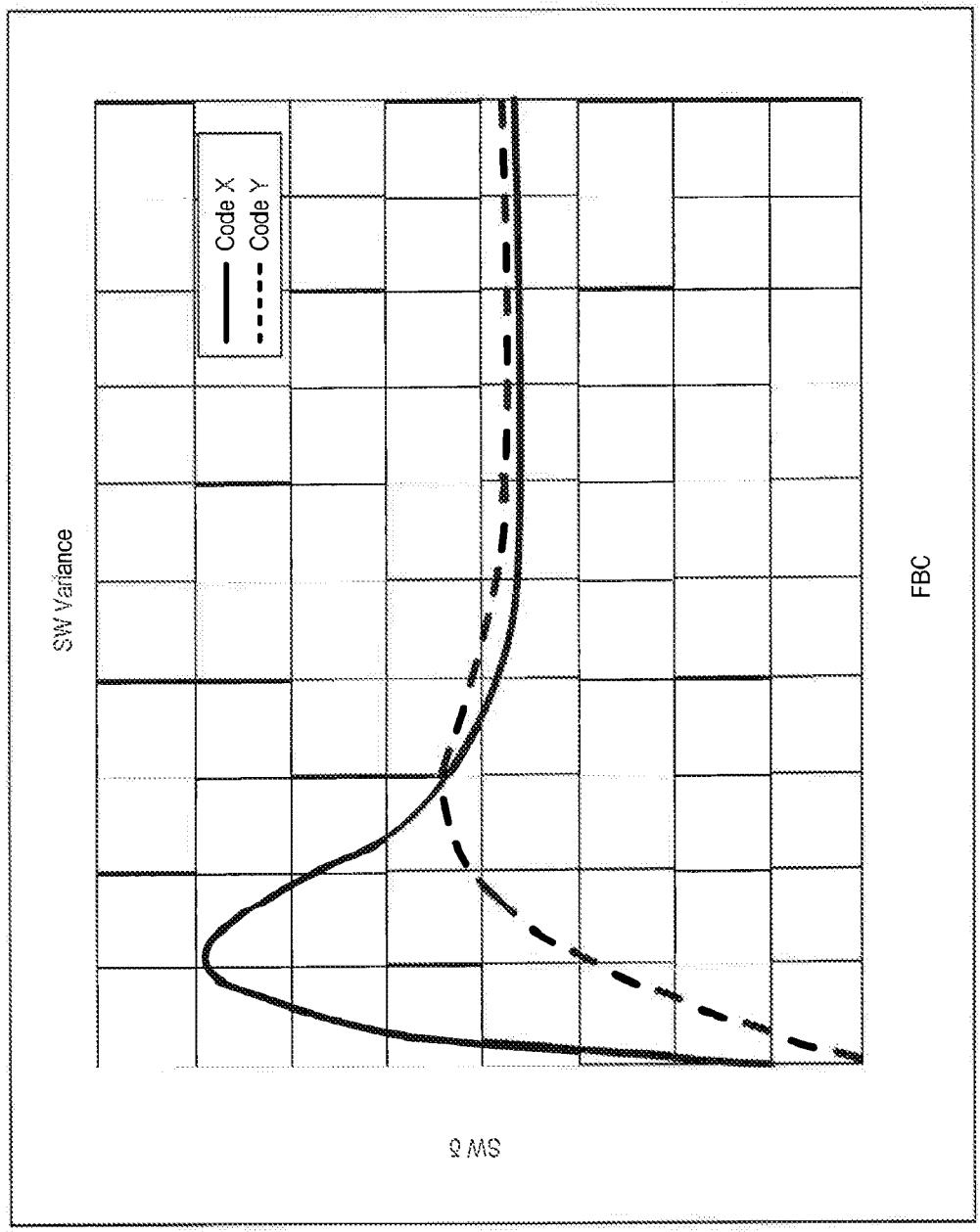
FIG. 6 is a graph of an embodiment showing that the syndrome weight to failed bit count variance is code dependent.

The second disadvantage is related to the variance in syndrome weight for a given FBC. FIG. 6 shows the variance of the syndrome weight to FBC relation of the two codes directly. It is visible that Code X has a much-higher variance at lower FBCs, which can severely impact the calibration quality of methods that rely on syndrome weight.

The following paragraphs present several examples that take advantage of using bit error rate instead of syndrome weight when it is possible. It should be noted that these are merely examples and other implementations can be used.

Decision-Based ECC Read Threshold Calibration (Decision-Based BES)

As part of the BES operation, a grid of five or seven sense points is read allowing the emulation of all the 5^#TH or 7^#TH (where #TH stands for the number of thresholds in a corresponding logical page) different hypotheses for read threshold placement (note that the number of hypotheses is exponential with the number of thresholds). Then, syndrome weight is calculated (potentially on each of these hypotheses, but practically there are stopping conditions to the scanning process), and the read thresholds that minimize the syndrome weight are selected as the optimal read thresholds. In this embodiment, the syndrome weight calculation is swapped with a bit error rate calculation. The hardware may remain very similar to the currently used one, while the rest of the flow remains intact. In fact, the latency of the read threshold calibration operation may be drastically reduced as all the distinct thresholds of the logical page are now independent for the bit error rate calculation. The same is not true for the syndrome weight calculation. For a single BES hypothesis, if one of the thresholds is placed far from the optimal voltage, the syndrome weight will be very high, and scanning the other thresholds will not yield any distinguishable minimum. The BES scanning operation considers this, but the impact may be very high operation latency.

When operating the proposed decision-based read threshold calibration, the latency of the operation is set and very low. The bit error rate should only be calculated for 5*#TH or 7*#TH hypotheses. The minimum for each scanning comb will be selected as the optimal read threshold for that scanning comb, without any caveats or dependencies. For example, for BES-7, the number of hypotheses calculated is reduced: from 7^#TH to 7*#TH. For an X4 page with 4 thresholds this translates to 7^4=2401→7*4=28 hypotheses, which is almost two order of magnitude.

The benefit of this embodiment can be maximized when the bit error rate threshold is set not too low (as syndrome weight is a good representative of bit error rate when it is low) and not too high (to be decodable). When data with a marginally-high bit error rate is read (without SBs), it may be marked as a high bit error rate event. It is still decodable, but it is an indication to the system 100 that something is deteriorating.

As a first step, the system 100 calibrates read thresholds on the subject wordline to check whether it fixes the high bit error rate. If it does not, other recovery steps, such as read scrub, may follow. In this embodiment, read threshold calibration following a high bit error rate event mark will be conducted using the bit error rate rather than syndrome weight, as described above. Since the data is successfully decoded, the decoded data may either be used immediately or stored aside (e.g., on the CBA) for near-future use.

Figures 7, 8:
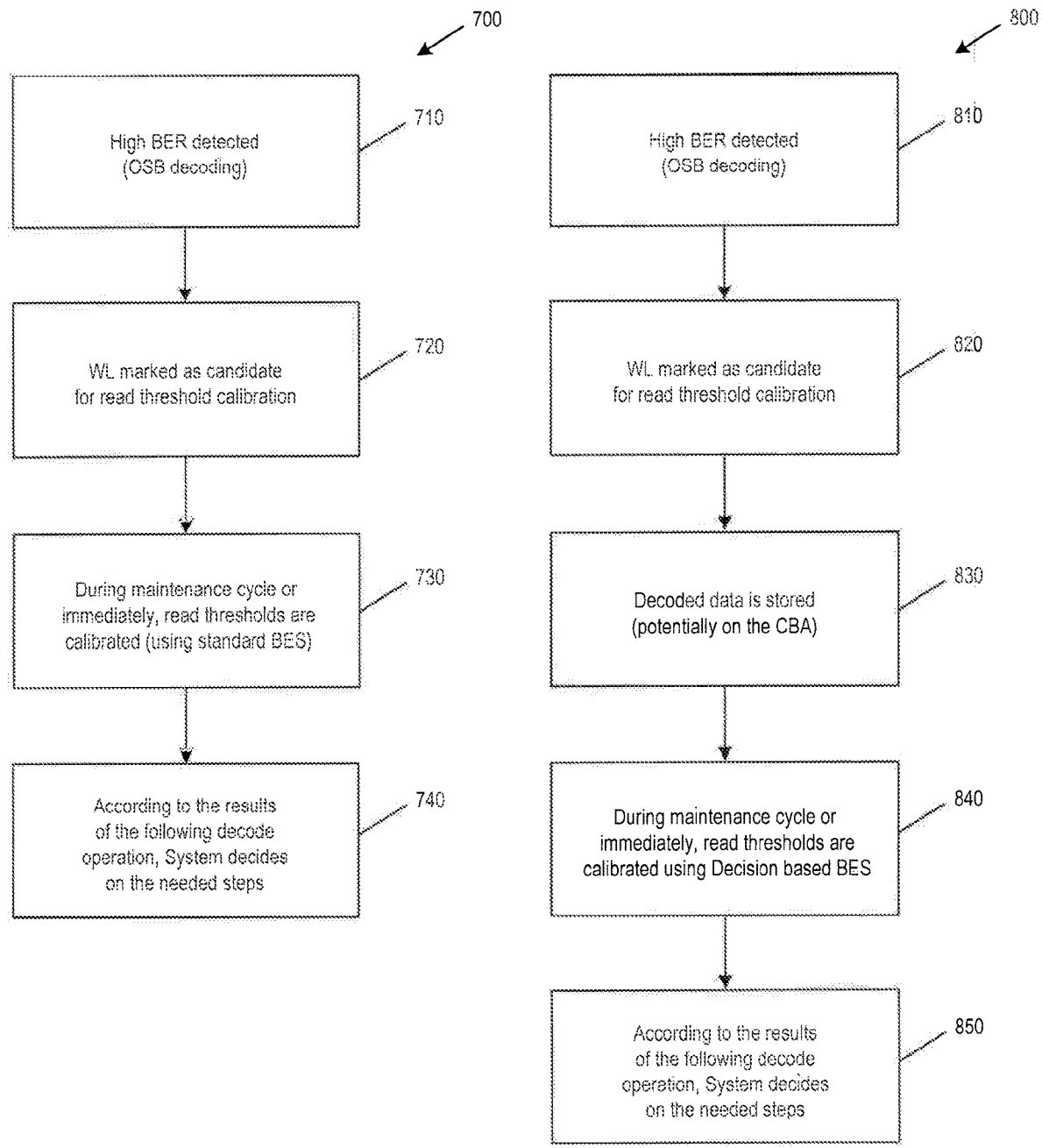
FIG. 7 is a flow chart of a method of an embodiment for high bit error rate (BER) processing.
FIG. 8 is a flow chart of a method of another embodiment for high bit error rate processing.

FIGS. 7 and 8 are flow charts 700, 800 that illustrate the methods discussed above. For the typical process flow (shown in FIG. 7), a high bit error rate (BER) is detected (e.g., using OSB decoding) (act 710). Next, the wordline is marked as a candidate for read threshold calibration (act 720). Then, during a maintenance cycle or immediately, the read thresholds are calibrated (e.g., using standard BES) (act 730). According to the results of the following decode operation, the system 100 decides on the needed steps (act 740). In contrast, in the process flow for the embodiments described above (shown in FIG. 8), after a high BER is detected (act 810) and the wordline is marked as a candidate (act 820), the decoded data is stored, potentially on the CBA (act 830). Then, during a maintenance cycle or immediately, the read thresholds are calibrated using a decision-based BES) (act 840), after which, the system 100 decides on the needed steps following the decode operation (act 850).

Figure 9:
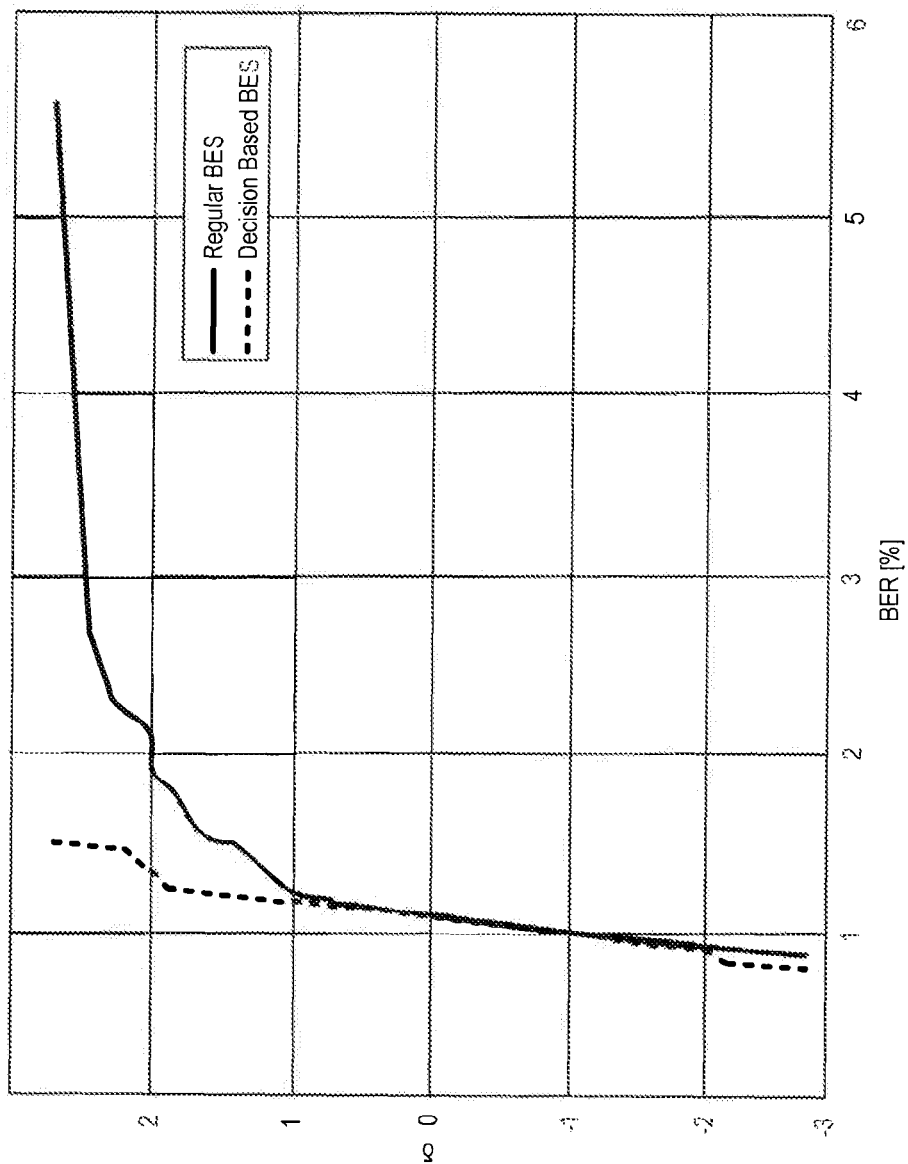
FIG. 9 is a sigma plot of an embodiment showing bit error rate performance comparison.

FIG. 9 is a graph that shows the accuracy gain of the decision-based method and is an example of the BES performance of the regular BES and decision-based BES of these embodiments. This is a sigma plot, showing on the y axis the probability to get the bit error rate on the x axis in sigma terms. As shown in FIG. 9, the BES performance of the regular BES is greatly impaired compared to the method of these embodiments. The main reason for this is the properties of the code itself, having a large syndrome weight/bit error rate variance, as described above.

Decision-Based CVD Read Threshold Calibration (Decision-Based Valley Search)

Another embodiment relates to a decision-based CVD read threshold calibration method/decision-based valley search. Valley Search (VS) is an algorithm to optimize read threshold by finding the minima on a Cell Voltage Distribution (CVD) histogram between every two adjacent states. It can be implemented inside the NAND die. The CVD histogram is drawn in some coarse resolution, and for every read threshold, the minimum of the histogram is chosen as the optimized read threshold. When the decoded data is available, it can be compared to the written data, and then instead of using the CVD histogram, the bit error rate can be utilized, using the same circuitry that found the minima on the CVD histogram. Unlike a CVD histogram, using bit error rate is accurate and independent of the shapes of the distributions. The minima on the CVD histogram may not align with the bit error rate minima, although it may be desired to eventually minimize the bit error rate.

Figures 10, 11:
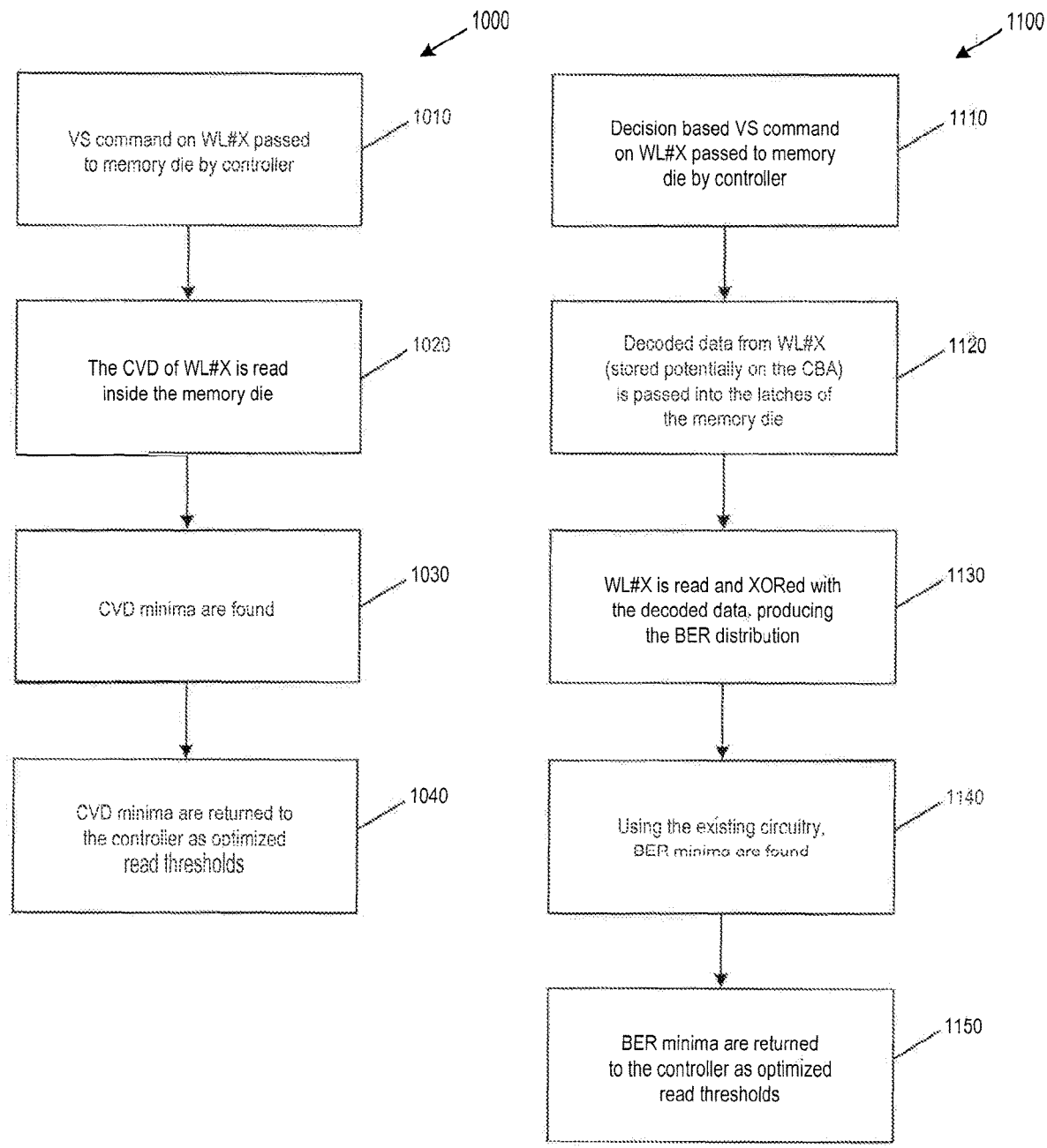
FIG. 10 is a flow chart of a method of an embodiment for valley search processing.
FIG. 11 is a flow chart of a method of another embodiment for valley search processing.

FIGS. 10 and 11 present flow charts 1000, 1100 that illustrate this. FIG. 10 illustrates the flow of a typical approach. As shown in FIG. 10, a valley search command on a given wordline is passed to the memory die 104 by the controller 102 (act 1010). Then, the CVD of the wordline is read inside the memory die 104 (act 1020). The CVD minim are found (act 1030) and are returned to the controller 102 as optimized read thresholds (act 1040). In contrast, with the flow of this embodiments (shown in FIG. 11), a decision-based valley search command on the wordline is passed to the memory die 104 by the controller 102 (act 1110). The decoded data from the wordline (stored potentially on the CBA) is passed into the latches of the memory die 104 (act 1120). The wordline is then read and XORed with the decoded data, producing the BER distribution (act 1130). Using existing circuitry, the BER minima are found (act 1140) and returned to the controller 102 as optimized read thresholds (act 1150). It should be noted that this embodiment is different from the previous approach that involves known data written into the NAND die and used for calibration. Here, there is no need to waste overprovisioning (OP) on known data, and all calibration is done on host data.

There are several advantages associated with these embodiments. For examples, the embodiments acquire more-accurate NAND read thresholds with reduced latency in many use cases, including in long sequential reads. Accurate NAND read thresholds can, in turn, increase throughput, reduce power, and improve the quality of service characteristics of the subject device.

Also, these embodiments can include the option to conduct emulations of reads instead of actually doing reads. Assume the storage system 100 reads at #reads_per_threshold at each read threshold and chooses the best between them (or use interpolation to better refine the result). In order to calibrate read thresholds of a four-threshold logical page, conventional approaches may need to perform 4*#readsper_threshold. In contrast, when these embodiments are used during a digital BER estimation scan, only #reads_per_threshold reads need to be conducted. If #reads_per_threshold=5 as in BES, this is 5 reads vs. 20 reads, which can be significant. Further, the calibration techniques in these embodiments can involve decoding data in the controller 102, then passing it to the CBA 400, and then conducting a read threshold calibration process independently from the controller 102. This can significantly reduce or avoid the overhead that is associated with multiple reads done by the controller 102.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, which are intended to define the scope of the claimed invention. Finally, it should be noted that any aspect of any of the embodiments described herein can be used alone or in combination with one another.

What is claimed is:

1. A storage system comprising:
   a memory; and
   a controller coupled to the memory and configured to:
   decode a codeword read from a wordline in the memory;
   determine that a bit error rate in the decoded codeword is above a threshold; and
   in response to determining that the bit error rate in the decoded codeword is above the threshold:
   designate the wordline as a candidate for read threshold calibration;
   store data from the decoded codeword; and
   cause read threshold calibration to be performed using the data from the decoded codeword instead of syndrome weight in a bit error rate estimate scan (BES).

2. The storage system of claim 1, wherein the read threshold calibration is performed upon determining that the bit error rate is above the threshold.

3. The storage system of claim 1, wherein the codeword is read during a sequential read operation.

4. The storage system of claim 1, wherein the read threshold calibration is performed during a maintenance operation.

5. The storage system of claim 1, wherein the data from the decoded codeword is stored in the controller.

6. The storage system of claim 1, wherein the data from the decoded codeword is stored in a complementary metal-oxide-semiconductor (CMOS) bonded array (CBA).

7. The storage system of claim 1, wherein the codeword is read during a maintenance operation.

8. The storage system of claim 1, wherein the read threshold calibration is performed in the memory.

9. The storage system of claim 1, wherein the read threshold calibration is performed in a complementary metal-oxide-semiconductor (CMOS) bonded array (CBA).

10. The storage system of claim 1, wherein the memory comprises a three-dimensional memory.

11. In a storage system comprising a controller and a memory, a method comprising:
    sending, from the controller to the memory, a decision-based valley search command for a wordline in the memory;
    decoding a codeword read from the wordline;
    passing data from the decoded codeword to latches in the memory;
    reading the wordline;
    generating a bit error rate distribution by performing an exclusive-or operation on data read from the wordline and the data from the decoded codeword; and
    performing a read threshold calibration by finding minima in the bit error rate distribution.

12. The method of claim 11, wherein the minima are found in the bit error rate distribution instead of a cell voltage distribution histogram.

13. The method of claim 11, wherein the read threshold calibration is performed in the memory.

14. The method of claim 11, wherein the read threshold calibration is performed in a complementary metal-oxide-semiconductor (CMOS) bonded array (CBA).

15. The method of claim 11, wherein the data from the decoded codeword is stored in the controller.

16. The method of claim 11, wherein the data from the decoded codeword is stored in a complementary metal-oxide-semiconductor (CMOS) bonded array (CBA).

17. The method of claim 11, wherein the read threshold calibration comprises a valley search operation.

18. The method of claim 11, further comprising sending a result of the read threshold calibration to a controller in the storage system.

19. A storage system comprising:
   a memory;
   means for decoding a codeword read from a wordline in the memory;
   means for determining that a bit error rate in the decoded codeword is above a threshold; and
   means for performing the following in response to determining that the bit error rate in the decoded codeword is above the threshold:
      designating the wordline as a candidate for read threshold calibration;
      storing data from the decoded codeword; and
      causing read threshold calibration to be performed using the data from the decoded codeword instead of syndrome weight in a bit error rate estimate scan (BES).

* * * * *